US012787695B2

(12) United States Patent
Chiu et al.

(10) Patent No.: US 12,787,695 B2
(45) Date of Patent: Nov. 3, 2026

(54) MODULARIZED LARGE-SIZED CARRIER

(71) Applicant: GUDENG PRECISION INDUSTRIAL CO., LTD., New Taipei City (TW)

(72) Inventors: Ming-Chien Chiu, New Taipei City (TW); En-Nien Shen, New Taipei City (TW); Yung-Chin Pan, New Taipei City (TW); Cheng-En Chung, New Taipei City (TW); Po-Ting Lee, New Taipei City (TW); Wei-Chien Liu, New Taipei City (TW)

(73) Assignee: GUDENG PRECISION INDUSTRIAL CO., LTD., New Taipei City (TW)

( * ) Notice: Subject to any disclaimer, the term of this patent is extended or adjusted under 35 U.S.C. 154(b) by 0 days.

(21) Appl. No.: 19/209,835

(22) Filed: May 16, 2025

(65) Prior Publication Data

US 2025/0273494 A1 Aug. 28, 2025

Related U.S. Application Data

(62) Division of application No. 17/381,216, filed on Jul. 21, 2021, now abandoned.

(60) Provisional application No. 63/081,902, filed on Sep. 22, 2020.

(51) Int. Cl.

| | |
|---|---|
| ***H10P 72/10*** | (2026.01) |
| ***B65D 21/02*** | (2006.01) |
| ***B65D 21/08*** | (2006.01) |
| ***B65D 25/10*** | (2006.01) |
| ***B65D 47/32*** | (2006.01) |
| ***H10P 72/00*** | (2026.01) |
| ***H10P 72/30*** | (2026.01) |

(52) U.S. Cl.
CPC ........ *H10P 72/127* (2026.01); *B65D 21/0204* (2013.01); *B65D 21/0213* (2013.01); *B65D 21/0228* (2013.01); *B65D 21/083* (2013.01); *B65D 25/107* (2013.01); *B65D 47/32* (2013.01); *H10P 72/0402* (2026.01); *H10P 72/18* (2026.01); *H10P 72/1914* (2026.01); *H10P 72/1926* (2026.01); *H10P 72/3302* (2026.01); *B65D 2205/02* (2013.01); *B65G 2201/0235* (2013.01); *B65G 2201/0297* (2013.01)

(58) Field of Classification Search
CPC ........... B65D 21/0204; B65D 21/0213; B65D 21/0228; B65D 21/083; H10P 72/12; H10P 72/13; H10P 72/15; H10P 72/3412
USPC ................. 248/346.1, 346.3, 346.6, 346.11; 269/903
See application file for complete search history.

(56) References Cited

FOREIGN PATENT DOCUMENTS

JP 2011077166 * 4/2011

* cited by examiner

*Primary Examiner* — Orlando E Aviles
*Assistant Examiner* — Sanjidul Islam

(57) ABSTRACT

A modularized large-sized carrier includes at least two body modules, at least one hermetic seal component and a back board. The body modules are connected to each other peripherally and arranged in a depth direction. The hermetic seal component surrounds junctions of the body modules. The back board is disposed behind the last one of the body modules. The modularized large-sized carrier overcomes existing carrier size limitations otherwise caused by injection molding machines and continuously expands in the depth direction to thereby enlarge the airtight storage space of the carrier.

4 Claims, 4 Drawing Sheets

MODULARIZED LARGE-SIZED CARRIER

CROSS-REFERENCE TO RELATED APPLICATION

This application is a divisional patent application of U.S. application Ser. No. 17/381,216 filed on Jul. 21, 2021, the entire contents of which are hereby incorporated by reference for which priority is claimed under 35 U.S.C. § 121.

BACKGROUND OF THE INVENTION

1. Field of the Invention

The present disclosure relates to carriers, and in particular to a modularized large-sized carrier.

2. Description of the Related Art

Existing commercially-available large-sized carriers, such as 12-inch wafer pods, are made by plastic injection molding. However, injection molding machines have size limitations and thus cannot inject integrally large-sized carriers of 500-800 mm. As a result, the size of the carriers is limited by the manufacturing factor, and thus the capacity of the carriers cannot be further increased.

If the size of a carrier increases, the sum of the weight of the carrier and the weight of a load will become greater than 100 kg, and the surface of the base of the carrier will deform and bend because of insufficient support and insufficient mechanical strength, thereby bringing about the need to change. These factors also cause limitations of the size of the large-sized carrier

BRIEF SUMMARY OF THE INVENTION

An objective of the present disclosure is to provide a modularized large-sized carrier, comprising: at least two body modules connected to each other peripherally and arranged in a depth direction; at least one hermetic seal component surrounding junctions of the body modules; and a back board disposed behind the last said body module.

In an embodiment of the present disclosure, the back board and the body modules are integrally connected.

In an embodiment of the present disclosure, the back board is transparent, translucent or opaque.

In an embodiment of the present disclosure, the body modules are fastened with screws or snap-engaged with each other.

In an embodiment of the present disclosure, two outer sides of the body modules each have a delivery channel extending in the depth direction.

In an embodiment of the present disclosure, the delivery channel has a positioning notch portion.

In an embodiment of the present disclosure, two outer sides of the body modules each have a perpendicular slot, and the perpendicular slot extends in a height direction perpendicular to the depth direction.

In an embodiment of the present disclosure, the modularized large-sized carrier further comprising: an outer bottom board having an outer side and an inner side, the inner side facing bottom sides of the body modules; a plurality of reinforcement groove elements removably disposed on the outer side and each having a rail; and a plurality of reinforced elements being slender, spaced apart by a specific distance and arranged between the outer bottom board and bottom sides of the body modules, wherein bottoms and tops of the reinforced elements abut against the outer bottom board and bottom sides of the body modules, respectively.

In an embodiment of the present disclosure, the reinforced elements, the outer bottom board and bottom sides of the body modules form a H-shaped structure.

In an embodiment of the present disclosure, the reinforcement groove elements are made of metal.

In an embodiment of the present disclosure, the reinforced elements are made of a metal or carbon fiber composite.

Therefore, a modularized large-sized carrier of the present disclosure overcomes carrier size limitations caused by conventional injection molding machines, expands continuously in the depth direction and thus enlarges an airtight storage space for a load, further reinforces the base of the modularized large-sized carrier, dispenses with the hassle of changing the modularized large-sized carrier in whole, prevents bending and deformation otherwise resulting from a long time period of weight bearing, reduces the time taken to change, reduces cost, and extends the service life of the modularized large-sized carrier.

DETAILED DESCRIPTION OF THE INVENTION

To facilitate understanding of the object, characteristics and effects of this present disclosure, embodiments together with the attached drawings for the detailed description of the present disclosure are provided.

Figure 1:
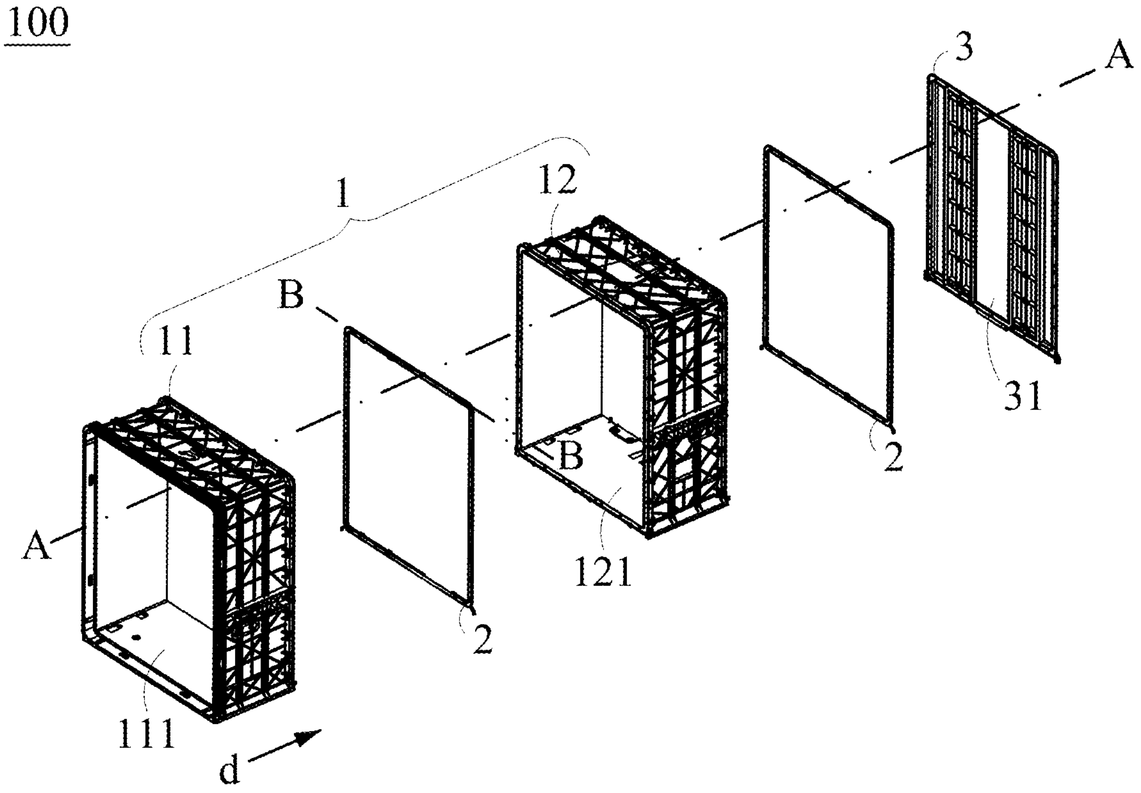
FIG. 1 is an exploded view of a modularized large-sized carrier according to an embodiment of the present disclosure.
Figure 2:
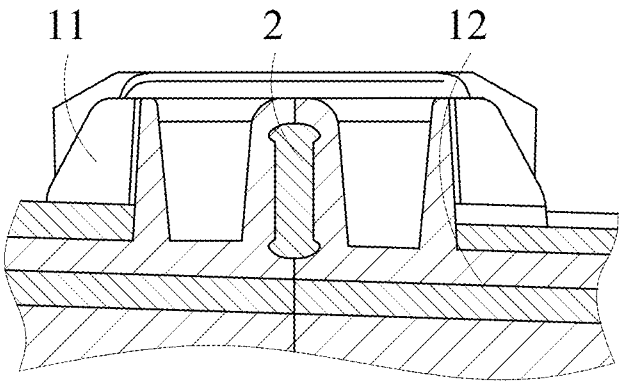
FIG. 2 is a longitudinal cross-sectional view taken along line A-A of FIG. 1.
Figure 3:
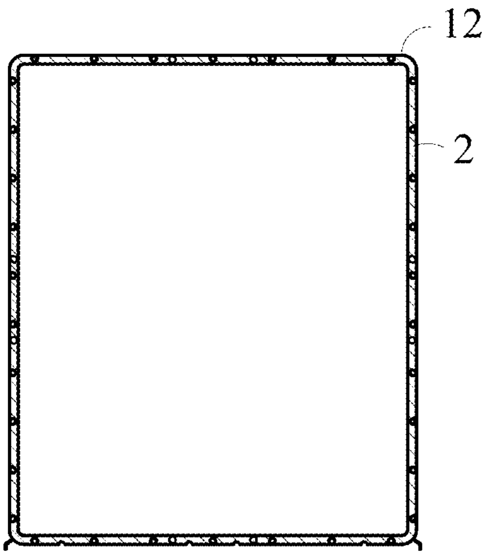
FIG. 3 is a transverse cross-sectional view taken along line B-B of FIG. 1.

Referring to FIG. 1 through FIG. 3, in an embodiment of the present disclosure, a modularized large-sized carrier 100 comprises at least two body modules 1, at least one hermetic seal component 2 and a back board 3.

In this embodiment, at least two body modules 1 each comprise a first body module 11 and a second body module 12. The edges of first body module 11 and the edges of second body module 12 are fixedly connected to each other and arranged in a depth direction d. Their connection is achieved with screws or effectuated with their engaging portions through snap-engagement. In a variant embodiment, the modularized large-sized carrier 100 may have much more body modules 1, including a third body module and a fourth body module, fitted together in the depth direction d, so as to form an airtight storage space of a large-sized carrier.

The hermetic seal components 2 surround junctions of the body modules 1 (first body module 11 and second body module 12) to hermetically seal the junction of the first body module 11 and second body module 12. Given the third body module and fourth body module, the hermetic seal component 2 may also be disposed in the vicinity of the body modules 1. The hermetic seal component 2 is, for example, an airtight rubber strip, but the present disclosure is not limited thereto.

The back board 3 is disposed behind the last one of the body modules 1. In this embodiment, the last one of the body modules 1 is the second body module 12, and thus the back board 3 is disposed at the second body module 12. In this embodiment, the back board 3 and second body module 12 are separate, and thus the hermetic seal component 2 is disposed between the back board 3 and the second body module 12 to hermetically seal the junction of the second body module 12 and the back board 3. In a variant embodiment, the back board 3 is integrally formed behind the last one of the body modules 1. Thus, the back board 3 and the last one of the body modules 1 are integrally connected by injection molding. For instance, the second body module 12 and the back board 3 are the same injection element.

The modularized large-sized carrier 100 further has a front door (not shown) disposed in front of the first body module 11 (relative to the back board 3). The front door, body modules 1 and back board 3 are injection-style plastic elements, but the present disclosure is not limited thereto.

According to the present disclosure, since the body modules 1 and the hermetic seal component 2 are coupled together, the modularized large-sized carrier 100 overcomes existing carrier size limitations otherwise caused by injection molding machines and continuously expands in the depth direction to thereby enlarge the airtight storage space of the carrier.

In this embodiment, the back board 3 is transparent, translucent or opaque. Referring to FIG. 1, the back board 3 has a light penetrable zone 31. The light penetrable zone 31 is transparent or translucent. The transparency depends on the electromagnetic wave used in detection. Thus, the light penetrable zone 31 is transparent to (penetrable by) or translucent to (semi-penetrable by) the electromagnetic wave, that is, is not restricted to visible light but includes infrared and UV. In a variant embodiment, the back board 3 is fully occupied by the light penetrable zone 31 made of a transparent or translucent material. In another variant embodiment, the back board 3 is made of an opaque material and has a hollowed-out zone in which the light penetrable zone 31 made of a transparent or translucent material is formed. In a variant embodiment, the back board 3 is opaque, and both the back board 3 and second body module 12 are the same injection element.

Figure 4:
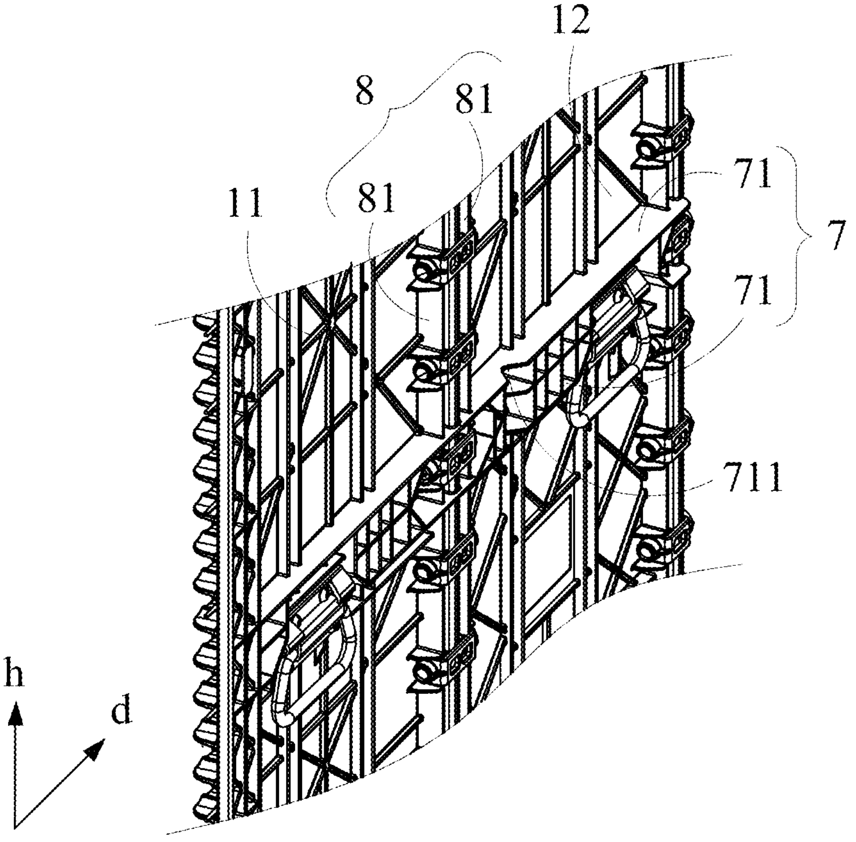
FIG. 4 is a perspective view of the modularized large-sized carrier according to an embodiment of the present disclosure.

In this embodiment, two outer sides of the body modules 1 each have a delivery channel 7 extending in depth direction d. FIG. 4 shows only the delivery channel 7 on the side of the first body module 11 and second body module 12, but the first body module 11 and second body module 12 are linear symmetrical. The other sides of the first body module 11 and second body module 12 also have the delivery channels 7 (not shown). The delivery channel 7 at least comprises two parallel ribs 71. The ribs 71 each have a positioning notch portion 711. When a robotic arm (not shown) vertically delivers the modularized large-sized carrier 100, the robotic arm slides in a direction parallel to the delivery channel 7 so as to be engaged with and fixed to the positioning notch portion 711 to perform transportation. The ribs 71 of the delivery channel 7 bear weight.

In this embodiment, the two outer sides of the body modules 1 each have a perpendicular slot 8. The perpendicular slot 8 extends in a height direction h perpendicular to the depth direction d. The perpendicular slot 8 at least comprises two parallel ribs 81. When the modularized large-sized carrier of the present disclosure rotates by 90 degrees, the ribs 71 of the delivery channel 7 can no longer bear weight (its extension direction is parallel to weight direction). At this point in time, the robotic arm grips the perpendicular slot 8 and uses the ribs 81 of the perpendicular slot 8 as the bear weight surface after rotation.

Figure 5:
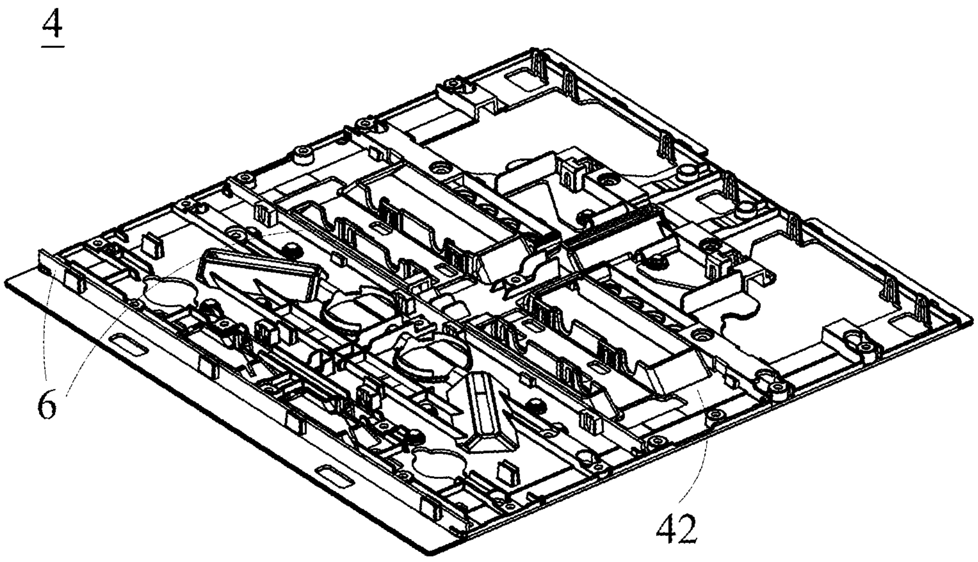
FIG. 5 is a perspective view of the modularized large-sized carrier, showing the inner surface of its outer bottom board, according to an embodiment of the present disclosure.
Figure 6:
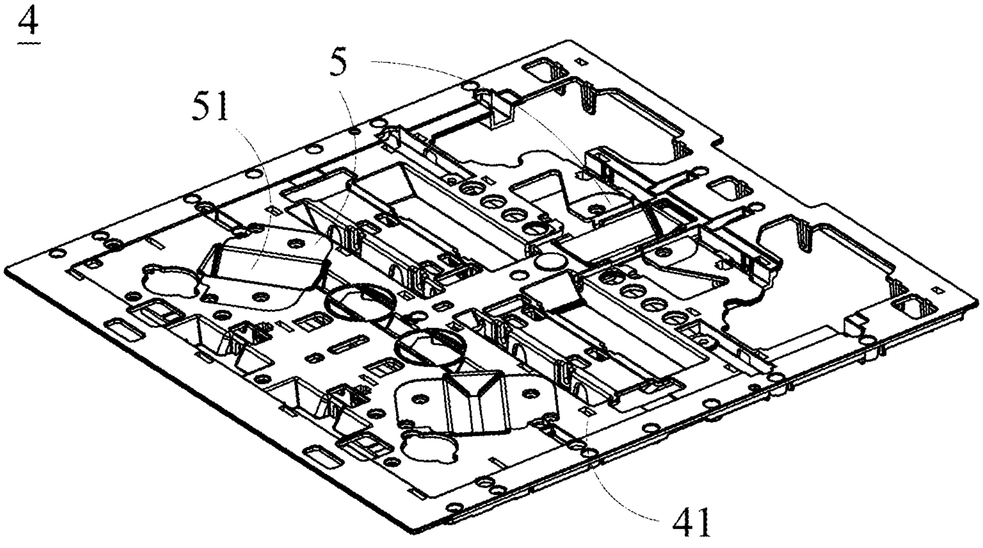
FIG. 6 is a perspective view of the modularized large-sized carrier, showing the outer surface of its outer bottom board, according to an embodiment of the present disclosure.
Figure 7:
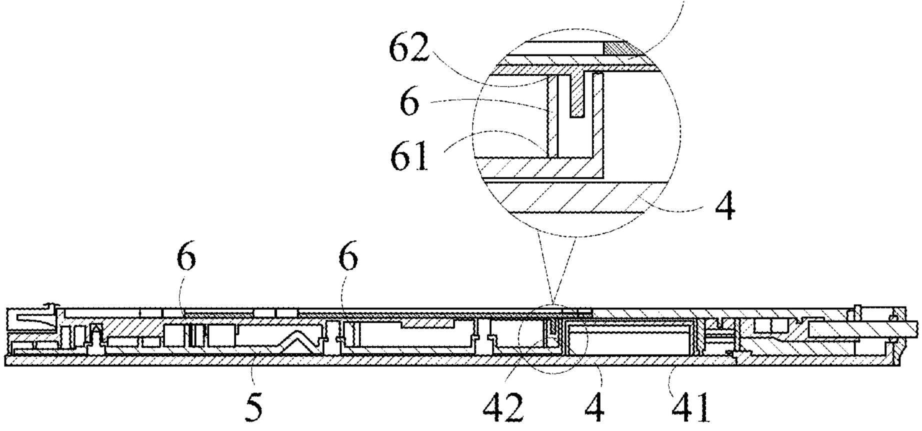
FIG. 7 is a cross-sectional view of the outer bottom board of the modularized large-sized carrier according to an embodiment of the present disclosure.

Referring to FIG. 5 through FIG. 7, in this embodiment, the modularized large-sized carrier 100 further comprises an outer bottom board 4, a plurality of reinforcement groove elements 5 and a plurality of reinforced elements 6.

The outer bottom board 4 has an outer side 41 and an inner side 42. The outer side 41 is the outer surface of a machine to allow the modularized large-sized carrier 100 to come into contact with the outside. By contrast, the inner side 42 faces bottom sides of the body modules 1.

Referring to FIG. 6, the reinforcement groove elements 5 are removably disposed on the outer side 41 and each have a rail 51. The rail 51 serves as a positioning sliding rail mechanism disposed between the modularized large-sized carrier 100 and any other machine or device. The reinforcement groove elements 5 are changeable and are fixed to the outer side 41 of the outer bottom board 4 by means of fastening or snap engagement. In this embodiment, the reinforcement groove elements 5 are in the number of three, but the present disclosure is not limited thereto.

Referring to FIG. 5 and FIG. 7, the reinforced elements 6 are slender, are spaced apart by a specific distance, and are arranged between the outer bottom board 4 and the bottom sides 111, 121 of the body modules 1. The reinforced elements 6 are equidistant or not equidistant from each other and are preferably parallel to each other. The bottoms 61 and tops 62 of the reinforced elements 6 abut against (contact tightly) the outer bottom board 4 and the bottom sides 111, 121 of the body modules 1, respectively, to form a H-shaped structure (H-beam). This structure is strongly resistant to bending and thus conducive to "instant demounting, instant mounting," reinforcement of the base of the modularized large-sized carrier 100, and prevention of bending and deformation otherwise resulting from a long time period of weight bearing. The reinforcement groove elements 5 not only reduce wear and tear but can also be changed even in case of wear and tear, so as to dispense with the hassle of changing the modularized large-sized carrier 100 in whole, reduce the time taken to change, reduce cost, and extend the service life of the modularized large-sized carrier 100.

In this embodiment, the reinforcement groove elements 5 are made of metal. However, the present disclosure is not limited thereto, as the reinforcement groove elements 5 may also be made of any other material which is mechanically strong and resistant to wear and tear.

In this embodiment, the reinforced elements 6 are made of metal. However, the present disclosure is not limited thereto, as the reinforced elements 6 may also be made of any material which is mechanically strong and lightweight, such as a carbon fiber composite.

While the present disclosure has been described by means of specific embodiments, numerous modifications and variations could be made thereto by those skilled in the art without departing from the scope and spirit of the present disclosure set forth in the claims.

What is claimed is:

1. A modularized large-sized carrier, comprising:
at least two body modules connected to each other peripherally and arranged in a depth direction;
at least one hermetic seal component surrounding junctions of the body modules;
a back board disposed behind the last said body module;
an outer bottom board having an outer side and an inner side, the inner side facing bottom sides of the body modules;
a plurality of reinforcement groove elements removably disposed on the outer side and each having a rail; and
a plurality of reinforced elements being slender, spaced apart by a specific distance and arranged between the outer bottom board and bottom sides of the body modules, wherein bottoms and tops of the reinforced elements abut against the outer bottom board and bottom sides of the body modules, respectively.

2. The modularized large-sized carrier of claim 1, wherein the reinforced elements, the outer bottom board and bottom sides of the body modules form a H-shaped structure.

3. The modularized large-sized carrier of claim 1, wherein the reinforcement groove elements are made of metal.

4. The modularized large-sized carrier of claim 1, wherein the reinforced elements are made of a metal or carbon fiber composite.

* * * * *